United States Patent
Hekmatshoartabari et al.

(10) Patent No.: US 11,594,617 B2
(45) Date of Patent: Feb. 28, 2023

(54) VERTICAL RECONFIGURABLE FIELD EFFECT TRANSISTOR

(71) Applicant: International Business Machines Corporation, Armonk, NY (US)

(72) Inventors: Bahman Hekmatshoartabari, White Plains, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/093,716

(22) Filed: Nov. 10, 2020

(65) Prior Publication Data

US 2022/0149184 A1    May 12, 2022

(51) Int. Cl.
*H01L 29/66* (2006.01)
*H01L 29/423* (2006.01)
*H01L 29/78* (2006.01)

(52) U.S. Cl.
CPC .... *H01L 29/66666* (2013.01); *H01L 29/4232* (2013.01); *H01L 29/66553* (2013.01); *H01L 29/7827* (2013.01); *H01L 29/7845* (2013.01)

(58) Field of Classification Search
CPC ........... H01L 29/66666; H01L 29/4232; H01L 29/66553; H01L 29/7827; H01L 29/7845
(Continued)

(56) References Cited

U.S. PATENT DOCUMENTS 10,276,714 B2    4/2019   Balakrishnan
2017/0249988 A1  8/2017   Kan'an et al.
(Continued)

FOREIGN PATENT DOCUMENTS

CN    110164958    1/2018
KR    101881068    7/2018

OTHER PUBLICATIONS

Baldauf et al. ('Strain-Engineering for Improved Tunneling in Reconfigurable Silicon Nanowire Transistors', EUROSOI-ULIS 2016) (Year: 2016).*

(Continued)

*Primary Examiner* — Mohammad M Hoque
(74) *Attorney, Agent, or Firm* — Daniel P. Morris; Nick Cadmus; Lou Percello, Attorney, PLLC

(57) ABSTRACT

A Vertical Reconfigurable Field Effect Transistor (VRFET) has a substrate and a vertical channel. The vertical channel is in contact with a top silicide region that forms a lower Schottky junction with the vertical channel and a top silicide region that forms an upper Schottky junction with the vertical channel. The lower silicide region and the upper silicide region each form a source/drain (S/D) of the device. A lower gate stack surrounds the vertical channel and has a lower overlap that encompasses the lower Schottky junction. An upper gate stack surrounds the vertical channel and has an upper overlap that encompasses the upper Schottky junction. The lower gate stack is electrically insulated from the upper gate stack. The lower gate stack can electrically control the lower Schottky junction (S/D). The upper gate stack can electrically control the upper Schottky junction (S/D). The control of the lower Schottky junction (S/D) is independent and separate from the control of the upper Schottky junction (S/D). The upper gate stack is stacked above the lower gate stack enabling a reduced device footprint.

18 Claims, 15 Drawing Sheets

(58) Field of Classification Search
USPC .......................................................... 257/288
See application file for complete search history.

(56) References Cited

U.S. PATENT DOCUMENTS

2018/0012996 A1    1/2018  Baldauf et al.
2019/0067459 A1*   2/2019  Balakrishnan .... H01L 27/10802

OTHER PUBLICATIONS

'High-Performance Reconfigurable Si Nanowire Field-Effect Transistor Based on Simplified Device Design', IEEE Transactions on Nanotechnology, vol. 15, No. 2, Mar. 2016 (Year: 2016).*
M. De Marchi et al., Polarity Control in Double-Gate, Gate-All-Around Vertically Stacked Silicon Nanowire FETs, IEDM, 978-1-4673-4871-3/12/$31.00 ©2012, IEEE.
T. Baldauf, A. Heinzig, T. Mikolajick, and W. M. Weber, "Vertically Integrated reconfigurable Nanowire Arrays", IEEE Elect. Device Lett., vol. 39, No. 8, Aug. 2018, pp. 1242-1245, doi: 10.1109/LED. 2018.2847902.
Tiger Zhou, Stacked-FET Switches Enable High Efficiency, High-Density Solutions, Analog Applications Journal, 1Q 2015, www.ti.com.
A. Heinzig, S. Slesazeck, F. Kreupl, T. Mikolajick, and W. M. Weber, "Reconfigurable silicon nanowire transistors," Nano Lett., vol. 12, No. 1, pp. 119-124, 2012, doi: 10.1021/nl203094h.
Tim Baldauf, Andre Heinzig, Jens Trommer, Thomas Mikolajick, Walter Michael Weber, "Tuning the tunneling probability by mechanica stress in Schottky barrier based reconfigurable nanowire transistors", "Solid-State Electronics", 128 (2017), 148-154.
Tim Baldauf, Andre Heinzig, Jens Trommer, Thomas Mikolajick, Walter Michael Weber, "Stress Dependent Performance Optimization of Reconfigurable Silicon Nanowire Transistors", EDL—2015-06-1001.R1, IEEE Electron Device Letters, Oct. 2015, DOI: 10.1109/LED.2015.
T. Krauss, F. Wessely, and U. Schwaike, "Fabrication and simulation of electrically reconfigurable dual metal-gate planar field-effect transistors for dopant-free CMOS," in Proc. 12th Int. Conf. Design Technol. Integr. Syst. Nanosc. Era (DTIS), Apr. 2017, pp. 1-6, doi: 10.1109/DTIS. 2017.7930155.
J. Trommer, A. Heinzig, T. Baldauf, S. Slesazeck, T. Mikolajick, and W. M. Weber, "Functionality-enhanced logic gate design enabled by symmetrical reconfigurable silicon nanowire transistors," IEEE Trans.Nanotechnol., vol. 14, No. 4, pp. 689-698, Jul. 2015, doi: 10.1109/TNANO.2015.2429893.
Michael Raitza, Akash Kumar, Marcus Volp, Dennis Walter, Hens Trommer, Thomas Mikolajick, Walter M. Weber, "Expoloiting Transistor-Level Reconfiguration to Optimized Combinational Circuits", 978-3-9815370-8-6/17/$31.00 C 2017 IEEE.
Luca Amaru, Pierre-Emmanuel Gaillardon, Giovanni De Micheli, "Majority-Inverter Graph: A Novel Data-Structure and Algorithms for Efficient Logic Optimization", Integrated Systems Laboratory (LSI), EPFL, Switzerland , DAC '14, Jun. 1-5, 2014, San Francisco, Ca, USA, Copyright 2014 ACM 978-1-4503-2730-5/14/06$15.00
Abstract_for_CN_110164958_Translation.
Abstract_for_KR_101881068_Translation.
CN110164958B_Asymmetric_reconfigurable_field_effect_transistor_Translation.
KR101881068B1_Engiish_Translation.
Patent Cooperation Treaty (PCT) International Searching Authority International Search Report (ISR) and Written Opinion (WO).

* cited by examiner

VERTICAL RECONFIGURABLE FIELD EFFECT TRANSISTOR

BACKGROUND

The present invention relates to Reconfigurable Field Effect Transistors (RFETs). More specifically, the invention relates to vertical RFETs with a reduced footprint.

A Reconfigurable Field Effect Transistor (RFET) is a FET (Field Effect Transistor) with gated Schottky junctions used as the source and drain (S/D) of the FET. The voltage applied to the gated S/D contacts determines whether the FET behaves as a n-FET or p-FET.

Advantages of RFETs include: i. reducing transistor count (e.g. by an approximate factor of 2 for logic gates), ii. enabling design of reconfigurable logic gates, and iii. enabling doping-free transistors.

However, current RFETs have shortcomings that limit their use. Current RFETs have large footprints that occupy large areas on substrate surfaces and therefore reduce device density in fabricated semiconductor chips.

There is a need for RFETs with small footprints.

SUMMARY

Embodiments of the present invention include a Vertical Reconfigurable Field Effect Transistor (VRFET) that has a substrate and a vertical channel, e.g. substantially perpendicular to the substrate. The vertical channel is made from a semiconductor material and can be undoped. The vertical channel is in contact with a bottom/lower silicide region that forms a bottom/lower Schottky junction with the vertical channel and a top/upper silicide region that forms a top/upper Schottky junction with the vertical channel. The bottom/lower silicide region and the top/upper silicide region each form a source/drain (S/D) of the device.

A lower gate stack surrounds the vertical channel and has a lower overlap that encompasses the lower Schottky junction. An upper gate stack surrounds the vertical channel and has an upper overlap that encompasses the upper Schottky junction.

The lower gate stack is electrically insulated from the upper gate stack. The lower gate stack can electrically control the lower Schottky junction (S/D). The upper gate stack can electrically control the upper Schottky junction (S/D). The control of the lower Schottky junction (S/D) is independent and separate from the control of the upper Schottky junction (S/D).

The upper gate stack is stacked above the lower gate stack. In some embodiments, the vertical projection of both the upper and lower gate stacks on the substrate is the same. As such, the footprint of the device on the substrate is reduced.

Methods of making the device VRFET are disclosed.

BRIEF DESCRIPTION OF THE DRAWINGS

Various embodiments of the present invention will be described below in more detail, with reference to the accompanying drawings, now briefly described. The Figures show various apparatus, structures, and related method steps of the present invention.

DETAILED DESCRIPTION

Figure 1:
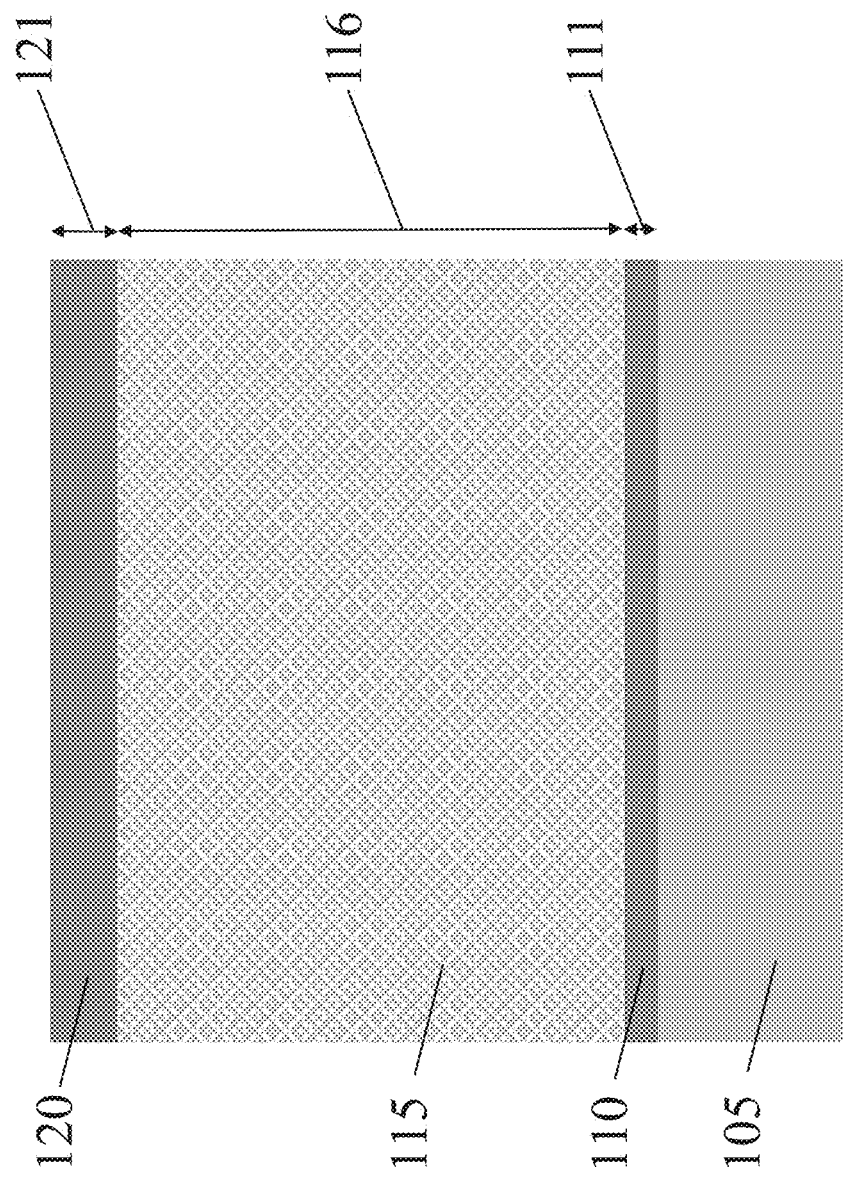
FIG. 1 is a cross section of an interim tri-layer dielectric stack structure.

It is to be understood that embodiments of the present invention are not limited to the illustrative methods, apparatus, structures, systems and devices disclosed herein but instead are more broadly applicable to other alternative and broader methods, apparatus, structures, systems and devices that become evident to those skilled in the art given this disclosure.

In addition, it is to be understood that the various layers, structures, and/or regions shown in the accompanying drawings are not drawn to scale, and that one or more layers, structures, and/or regions of a type commonly used may not be explicitly shown in a given drawing. This does not imply that the layers, structures, and/or regions not explicitly shown are omitted from the actual devices.

In addition, certain elements may be left out of a view for the sake of clarity and/or simplicity when explanations are not necessarily focused on such omitted elements. Moreover, the same or similar reference numbers used throughout the drawings are used to denote the same or similar features, elements, or structures, and thus, a detailed explanation of the same or similar features, elements, or structures may not be repeated for each of the drawings.

The semiconductor devices, structures, and methods disclosed in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, expert and artificial intelligence systems, functional circuitry, neural networks, etc. Systems and hardware incorporating the semiconductor devices and structures are contemplated embodiments of the invention.

As used herein, "height" refers to a vertical size of an element (e.g., a layer, trench, hole, opening, etc.) in the cross-sectional or elevation views measured from a bottom surface to a top surface of the element, and/or measured with respect to a surface on which the element is located.

Conversely, a "depth" refers to a vertical size of an element (e.g., a layer, trench, hole, opening, etc.) in the cross-sectional or elevation views measured from a top surface to a bottom surface of the element. Terms such as "thick", "thickness", "thin" or derivatives thereof may be used in place of "height" where indicated.

As used herein, "lateral," "lateral side," "side," and "lateral surface" refer to a side surface of an element (e.g., a layer, opening, etc.), such as a left or right-side surface in the drawings.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the elevation views, and "horizontal" refers to a direction parallel to the top surface of the substrate in the elevation views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop," "disposed on," or the terms "in contact" or "direct contact" means that a first element and a second element are connected without any intervening elements, such as, for example, intermediary conducting, insulating or semiconductor layers, present between the first element and the second element.

It is understood that these terms might be affected by the orientation of the device described. For example, while the meaning of these descriptions might change if the device was rotated upside down, the descriptions remain valid because they describe relative relationships between features of the invention.

Disclosed are structures and methods that enable a Vertical RFET (VRFET) with a small device footprint.

FIG. 1 is a cross section of an interim tri-layer dielectric stack structure 100.

The dielectric stack structure 100 includes a substrate 105, a bottom spacer 110, a dummy layer 115, and a top spacer 120.

The material making the substrate 105 includes one or more semiconductor materials. Non-limiting examples of suitable substrate 105 materials include Si (silicon), strained Si, Si:C (carbon doped silicon), Ge (germanium), SiGe (silicon germanium), SiGe:C (carbon doped silicon-germanium), Si alloys, Ge alloys, III-V semiconductor materials (e.g., GaAs (gallium arsenide), InAs (indium arsenide), InP (indium phosphide), or Indium Gallium Arsenide (InGaAs), or any combination thereof.

In some embodiments, the substrate 105 is silicon, e.g. either bulk silicon or silicon on insulator (SOI).

The bottom spacer 110, top spacer 120, and dummy layer 115 materials are deposited by known deposition processes, as non-limiting examples, chemical vapor deposition (CVD), physical vapor deposition (PVD), atomic layer deposition (ALD), plasma enhanced chemical vapor deposition (PECVD), inductively coupled plasma chemical vapor deposition (ICP CVD), or any combination thereof.

The bottom spacer 110 has a thickness 111 approximately between 5 nanometers (nm) and 20 nm or 5 nm and 12 nm. The thickness 121 of the top is spacer 120 is less critical because it will be removed later. In some embodiments, the top spacer 120 thickness 121 is between 20 nm and 100 nm.

The dummy layer 115 has a thickness 116 between 50 nm and 300 nm.

The materials making the bottom 110 and top 120 spacers are selectively etchable from the material of the dummy layer 115. For example, the "tri-layer dielectric stack" 110/115/120 can be made by layering a bottom spacer 110 made of silicon nitride ($Si_xN_y$), then layering the dummy layer 115 made of silicon oxide ($SiO_x$), then layering the top spacer 120 made of silicon nitride ($Si_xN_y$). In alternative embodiments, the order can be changed, for example, bottom spacer 110 ($SiO_x$), dummy layer 115 ($Si_xN_y$), and top spacer 120 ($SiO_x$).

Figure 2:
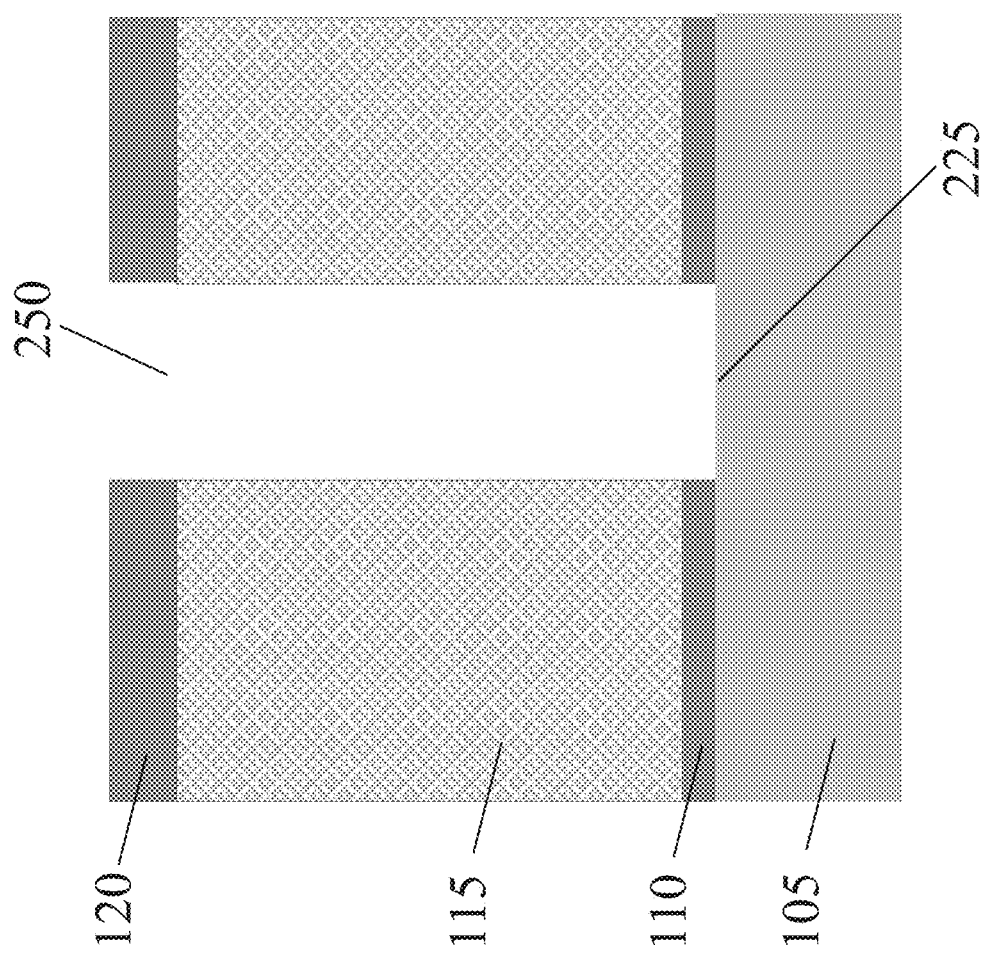
FIG. 2 is a cross section of an interim tri-layer dielectric stack structure with an etched trench.

FIG. 2 is a cross section of an interim tri-layer dielectric stack structure 200 with an etched trench 250.

In some embodiments, the trench 250 is etched using a process, e.g. a reactive ion etch (RIE), that is selective (will not substantially remove) the substrate 105 material, e.g. silicon. Accordingly, the trench 250 etching stops at the surface 225 of the substrate 105.

Is some embodiments, multiple etching processes are performed. For example, a first etch (selective to the dummy layer 115 material, removes the portion of the top spacer 120 within the trench 250, a second etch (selective to the bottom spacer 110 material) removes the portion of the dummy layer 115 within the trench 250, and a third etch (selective to the substrate 105 material) removes the portion of the bottom spacer 110 within the trench 250. The width of the trench 250 may be about 3 nm to about 20 nm, or about 6 nm to about 12 nm.

Figure 3:
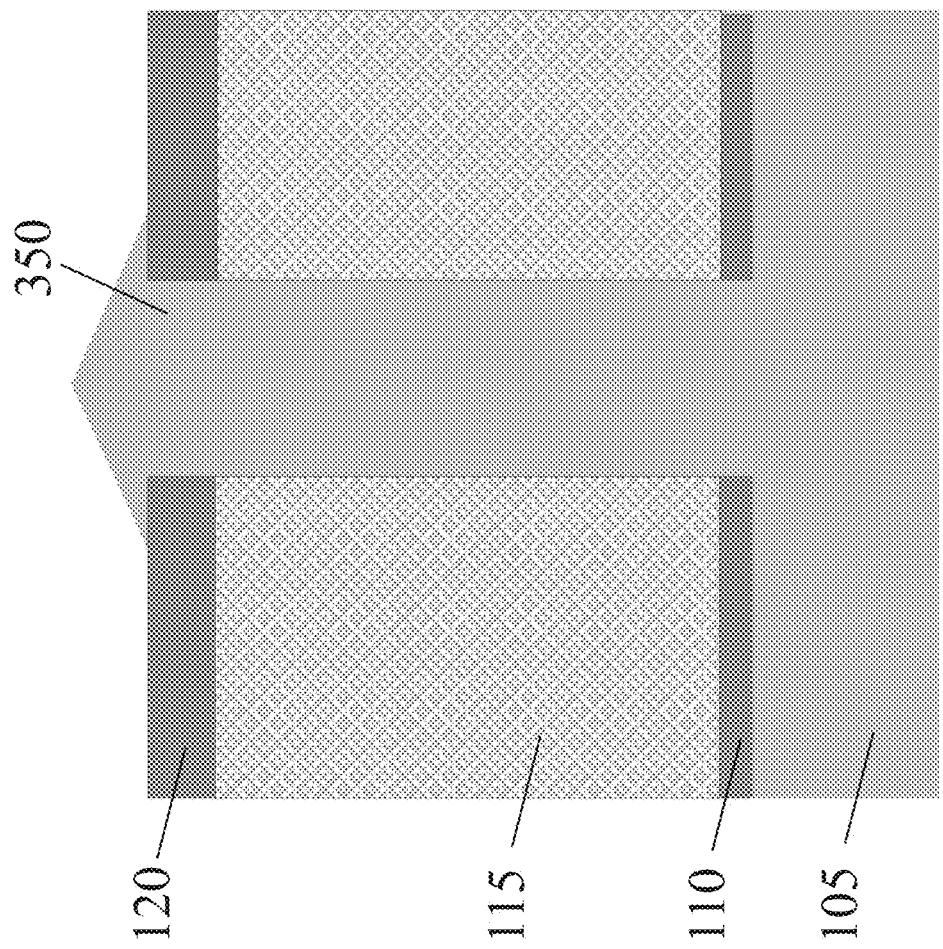
FIG. 3 is a cross section of an interim tri-layer dielectric stack structure with a channel epitaxially grown in a trench.

FIG. 3 is a cross section of an interim tri-layer dielectric stack structure 300 with a channel 350 epitaxially grown in the trench 250.

The channel 350 is an epitaxial layer grown on the exposed substrate 105 and is made of an epitaxial semiconductor material that forms of the substrate 105 surface 225. The epitaxial growth of the channel 350 extends over the top spacer 120.

The epitaxial growth can be performed by known methods using sources for the epitaxial channel which contain materials like silicon, germanium, or a combination thereof. A gas source for the deposition of epitaxial semiconductor material may include a silicon-containing gas source, a germanium-containing gas source, or a combination thereof. For example, an epitaxial silicon layer may be deposited from a silicon gas source that is selected from the group consisting of silane, disilane, trisilane, tetrasilane, hexachlorodisilane, tetrachlorosilane, dichlorosilane, trichlorosilane, and combinations thereof. An epitaxial germanium layer can be deposited from a germanium gas source that is selected from the group consisting of germane, digermane, halogermane, dichlorogermane, trichlorogermane, tetrachlorogermane and combinations thereof. An epitaxial silicon germanium alloy layer can be formed utilizing a combination of such gas sources. Carrier gases like hydrogen, nitrogen, or helium can be used.

In some embodiments, the channel 350 is made of silicon. In some embodiments, the channel 350 is undoped.

Figure 4:
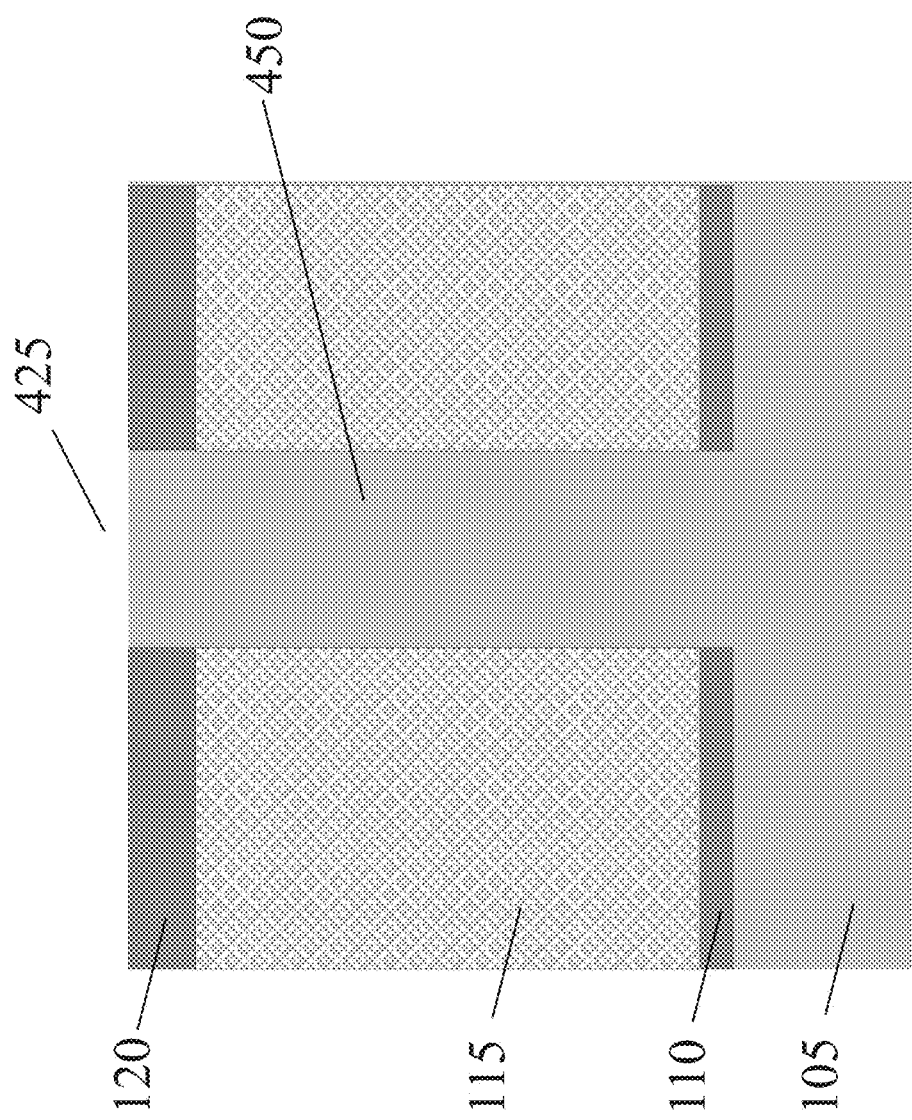
FIG. 4 is a cross section of a channel in an interim tri-layer dielectric stack structure after a Chemical-Mechanical Polishing (CMP).

FIG. 4 is a cross section of a channel in an interim tri-layer dielectric stack structure 400 after a Chemical-Mechanical Polishing (CMP). The CMP planarizes 425 the top of the epitaxial growth in the epitaxial channel 350/450 to be level with the top of the top spacer 120. Planarization processes like CMP are known.

Figure 5:
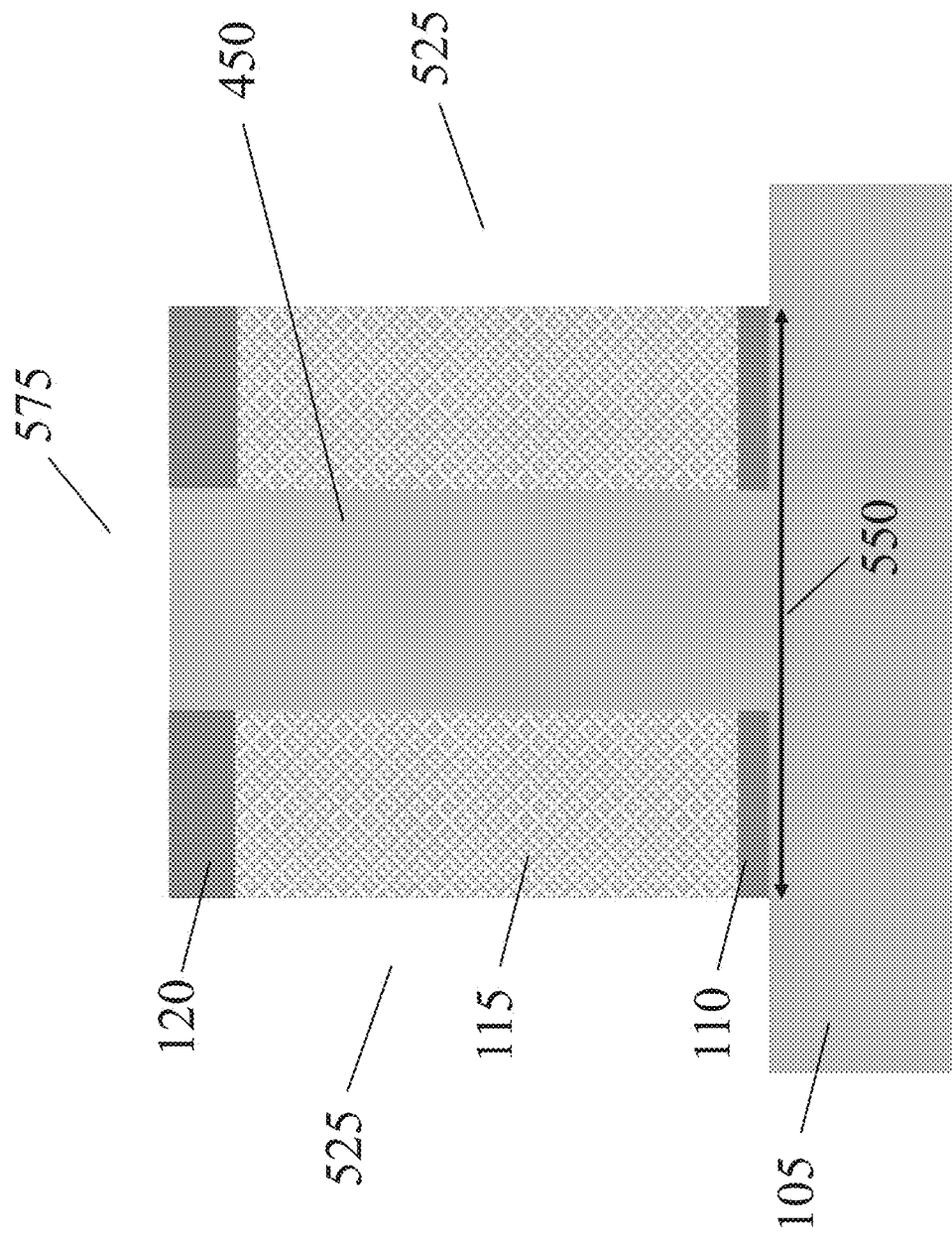
FIG. 5 is a cross section of a channel containing pillar, formed from by a patterned etch of the interim tri-layer dielectric stack.

FIG. 5 is a cross section of a pillar 500 containing the channel 450, formed from by a patterned etch of the interim tri-layer dielectric stack 400.

Using known patterning techniques, a mask protects top regions 575 of the pillar 500 while portions of the structure 525 are removed by a (or multiple) etch(es), e.g. RIE, that are selectable to the material in the substrate 105. In some embodiments, this step defines the footprint/width 550 of the device. The footprint/width 550 is on the order of 30 nm to 60 nm.

Figure 6:
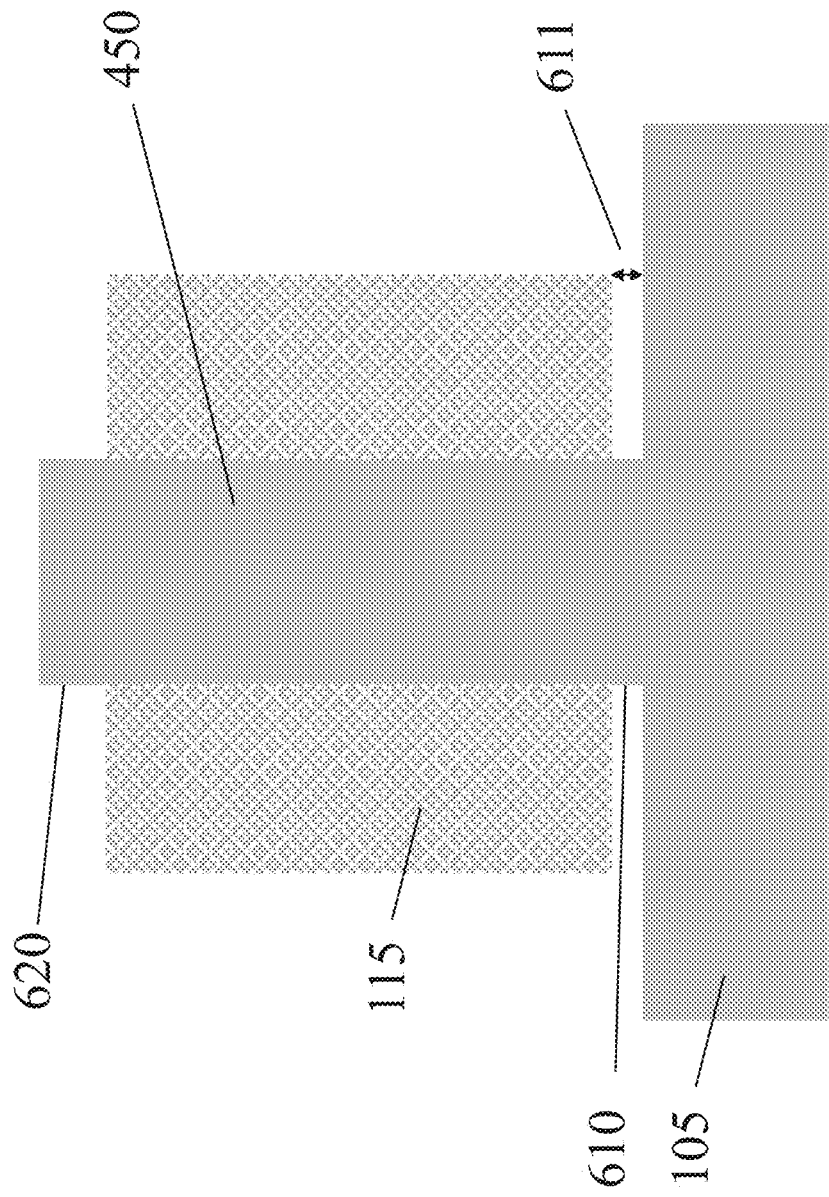
FIG. 6 is a cross section of an interim pillar structure with top and bottom regions of the channel exposed by a selective etch.

FIG. 6 is a cross section of an interim pillar structure 600 with top 620 and bottom 610 regions (and surfaces of and) around the channel 450 exposed by a selective etch. The exposure occurs by etching away the material of the bottom spacer 110 and top spacer 120. The bottom region of exposed side 610 of the channel 450 has a thickness equal to the thickness 111 of the bottom spacer 110.

As a non-limiting example, if the bottom 110 and top 120 spacer are made of a nitride, the etch used with remove the nitride is selective to the material making the substrate 105 and dummy layer 115, e.g. the silicon and $SiO_x$, respectively, that are substantially not removed by this etch.

Figure 7:
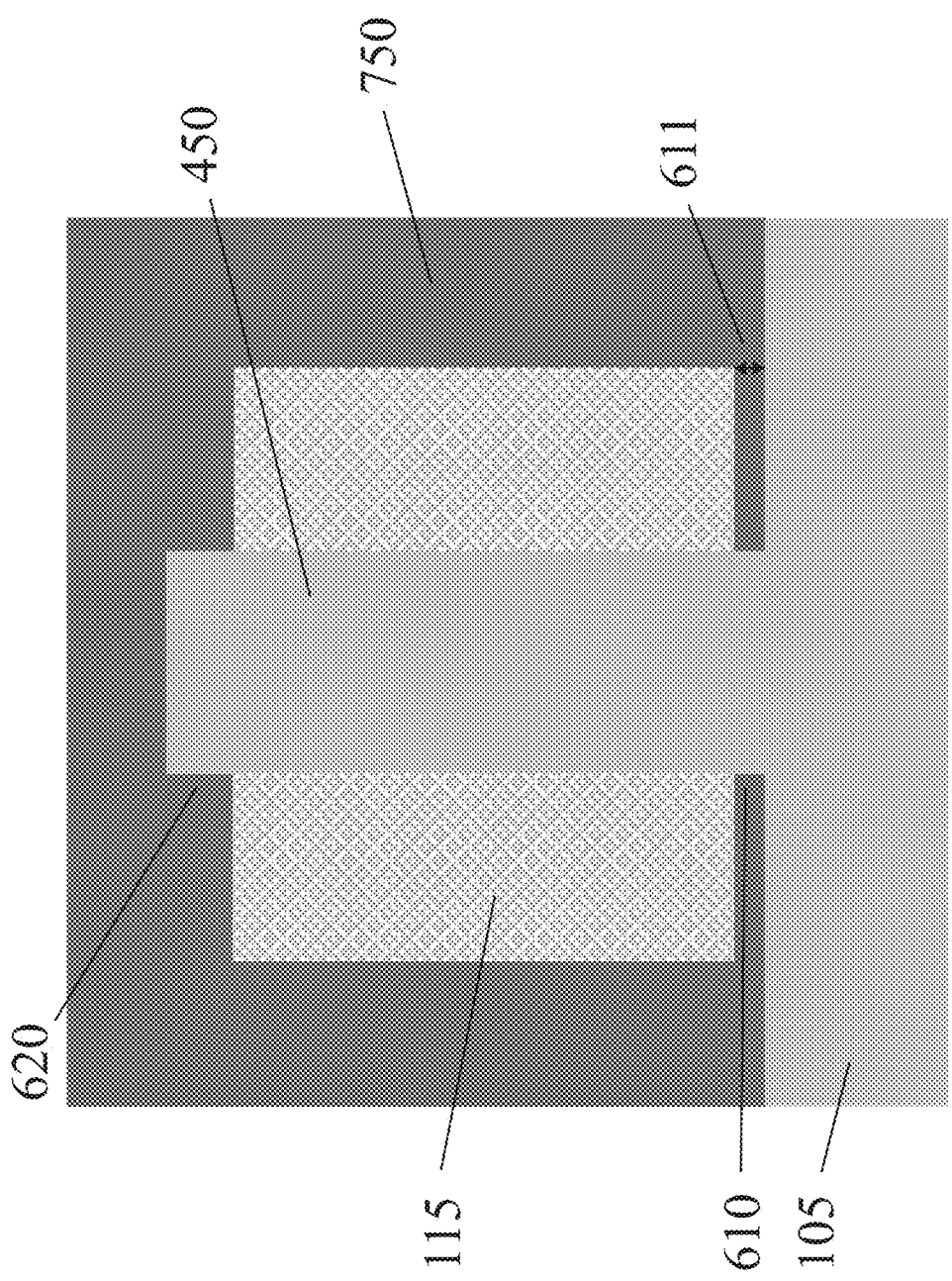
FIG. 7 is a cross section of the interim pillar structure after a metal deposition that is in contact with the exposed channel regions.

FIG. 7 is a cross section of the interim pillar structure 700 after a metal deposition 750 that is thick enough to envelop, surround, and cover the entire structure 600.

As such, the metal deposited 750 is in contact with the channel 450 side regions 610/620 previously exposed. The deposited metal 750 fills the void left by the bottom spacer 110 removal and accordingly has a thickness 611 approximately between 5 nm and 20 nm where the metal 750 contacts the exposed bottom regions/surfaces 610 around the channel 450.

Figure 8:
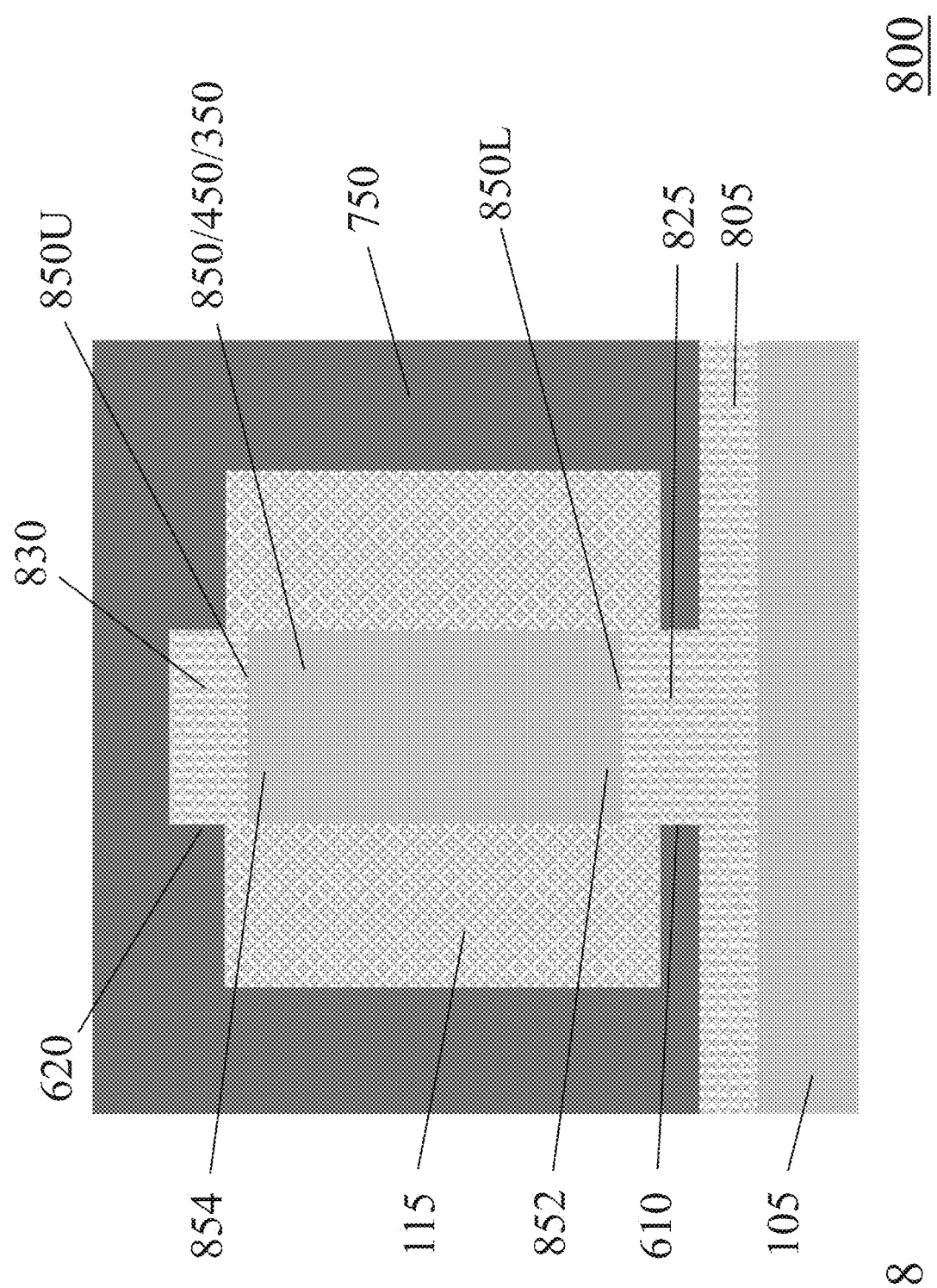
FIG. 8 is a cross section of the interim pillar structure after silicide regions are formed by an anneal process.

The metal 750 selected can form a silicide, as discussed in FIG. 8.

As a non-limiting example, the deposited metal 750 is nickel. In some embodiments, the metal 750 is deposited using conformal deposition techniques like ALD.

FIG. 8 is a cross section of the interim pillar structure 800 after silicide regions 805/825/830 are formed by one or more anneal processes.

As a non-limiting example, the structure 800 is heated above 500 degrees Celsius (C) for a time period determined by experiment. Under these conditions, the semiconductor surfaces (e.g. 610, 620, and the surface of the substrate 105) in contact with the metal 750 will from a silicide 805/825/830. As shown in FIG. 8 due to the anneal step(s), a substrate silicide layer 805 forms on the surface of the substrate 105; a bottom/lower silicide region 825 forms below the channel 850; and a top/upper silicide region 830 forms above the channel 850.

The silicide formation forms both: 1. a lower Schottky junction 850L between the channel 850 and the bottom/lower silicide region 825 and 2. an upper Schottky junction 850U between the channel 850 and the top/upper silicide region 830.

The silicide formation continues until both the lower Schottky junction 850L and upper Schottky junction 850U are within and surrounded by the dummy layer 115.

Accordingly, the structure 800 has a channel 850/450/350 that lies within and is surrounded by the dummy layer 115. The structure 800 has the lower Schottky junction 850L below a channel lower end 852 and the upper Schottky junction 850U above a channel 850 upper end 854. The lower 850L and upper 850U Schottky junctions are within and surrounded by the dummy layer 115.

Note that the silicide 805/825/830 forms only on semiconductor surfaces where there is contact with the metal 750 or silicide itself. The silicide 805/825/830 does not form on the dielectric dummy layer 115 surfaces. Accordingly, the lower 850L and upper 850U Schottky junctions are formed in exact alignment with the respective channel lower end 852 and the channel upper end 854.

Other processes for forming silicides and other "metal semiconductor alloys" are envisioned. For example, the structure 800 can be heated above 525 C for 15 minutes, etc. Processes for forming silicides on semiconductor surfaces are known and can involve different temperatures, times and number of times of high temperature exposure, etc. Non-limiting examples of silicides include nickel silicide ($NiSi_x$), erbium silicide, nickel platinum silicide ($NiPt_ySi_x$), platinum silicide (PtSi), cobalt silicide ($CoSi_x$), tantalum silicide ($TaSi_x$), titanium silicide ($TiSi_x$) and combinations thereof.

Figure 9:
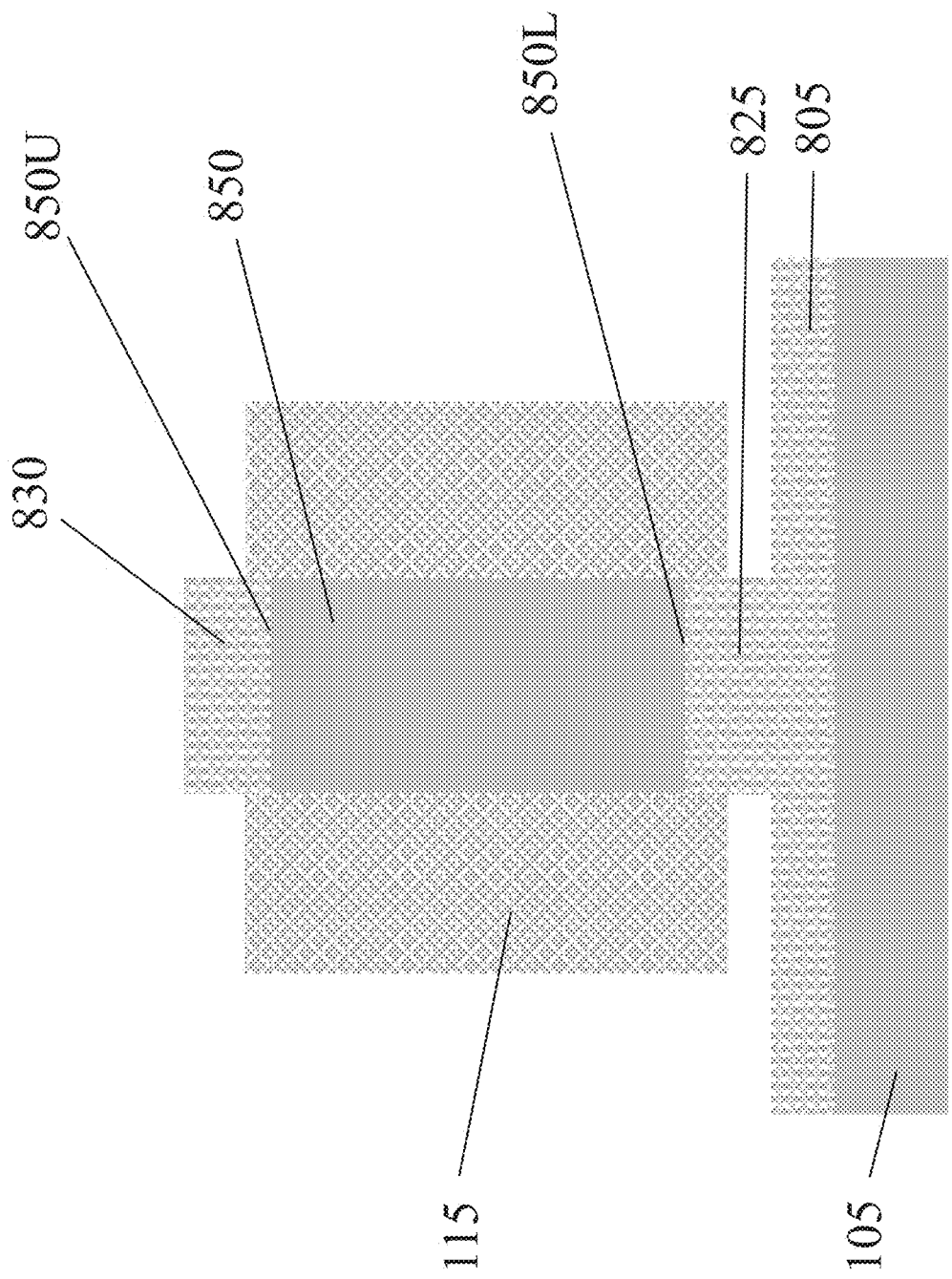
FIG. 9 is a cross section of the interim pillar structure with silicide regions after excess metal is removed.

FIG. 9 is a cross section of the interim pillar structure 900 with silicide regions 805/825/830 after excess metal 750 is removed.

Known etch chemistries remove the metal 750 but are selective (do not substantial remove) the silicide regions 805/825/830 or the dummy layer 115.

Figure 10:
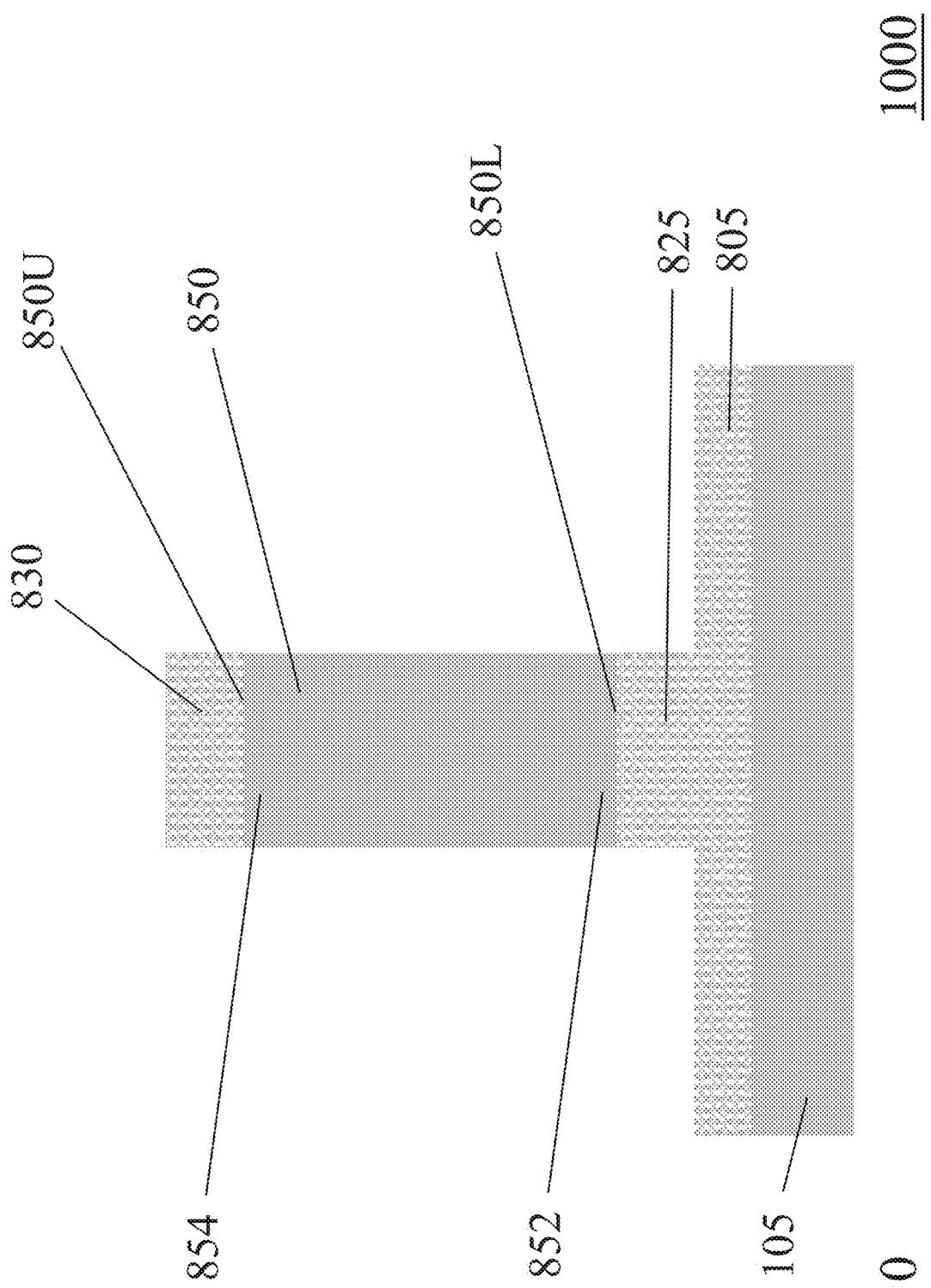
FIG. 10 is a cross section of the channel after an etch process exposes a lower and an upper Schottky junction at the respective channel lower end and the channel upper end.

FIG. 10 is a cross section of a structure 1000 with a vertical channel 850 after an etch process exposes the lower 850L and upper 850U Schottky junctions below the channel lower end 852 and above the channel upper end 854, respectively. The lower 850L and upper 850U Schottky junctions form a first and second source/drain, respectively. In some embodiments, the vertical channel 850 is perpendicular or substantially perpendicular to the substrate 105.

The etch process that removes the material making the dummy layer 115 is selective to (does not remove) the silicide 805/825/830 and the channel 850 material.

Figure 11:
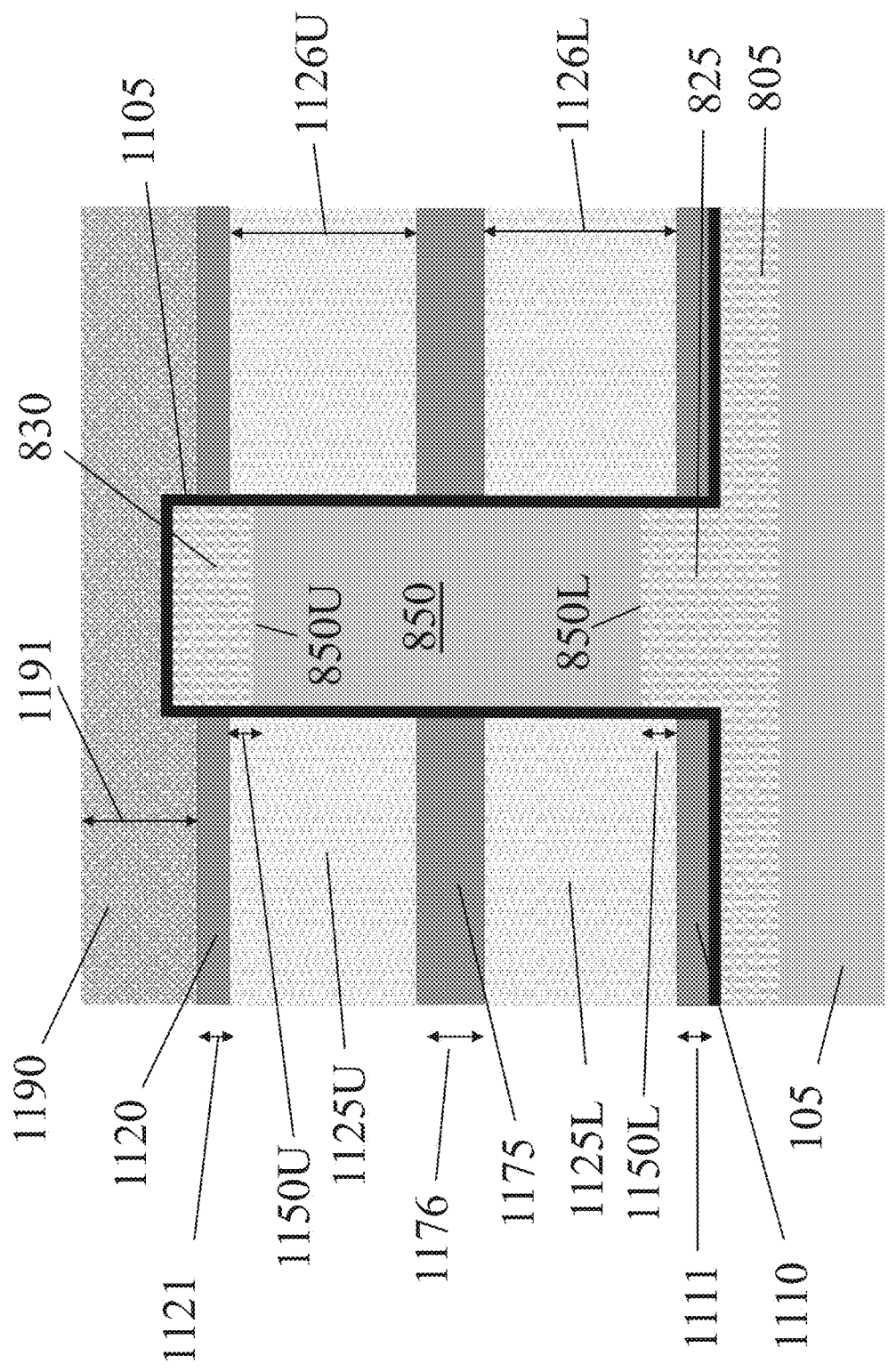
FIG. 11 is a cross section after a multilayer stack is deposited to encompass the channel.

FIG. 11 is a cross section of a structure 1100 after a multilayer stack is deposited to encompass the channel 850 and silicide regions 805/825/830 of structure 1000.

First a thin dielectric liner 1105 is deposited on the structure 1000. The liner 1105 is deposited by standard techniques including CVD, Atmospheric Pressure CVD (APCVD), Low Pressure CVD (LPCVD), PECVD, ALD, and any combinations thereof. In some embodiments, the liner 1105 is a continuous layer of a conformal thickness deposited by a conformal deposition process. In some embodiments, the liner 1105 thickness is approximately between 1 nm and 5 nm or between 1 nm and 3 nm and is made of silicon oxide.

A lower spacer 1110 is deposited with a direction deposition technique on the liner 1105. In some embodiments, the lower spacer has a lower spacer 1110 thickness 1111 of approximately between 5 nm and 20 nm, with 6 nm to 12 nm preferred. In some embodiments, the lower spacer 1110 is made of a nitride (e.g., silicon nitride) or dielectric oxynitride (e.g. SiOCN, or SiBC), In some embodiments, the lower spacer 1110 is made of silicon nitride deposited by a process like CVD or PVD.

The lower spacer thickness 1111 of the lower spacer 1110 is thin enough so that a lower overlap 1150L exists between the top surface of the lower spacer 1110 and the bottom/lower Schottky junction 850L.

In other words, the lower dummy gate 1125L (see below) will have a lower overlap 1150L of the lower Schottky junction 850L and the bottom/lower silicide region 825.

There is a tradeoff when designing the amount of optimum lower overlap 1150L. The lower overlap 1150L must be large enough to enable control of the lower Schottky junction 850L (by the lower gate stack 1325L/1375L, discussed below) but small enough so not to introduce too much stray capacitance.

In some embodiments, the lower overlap 1150L dimension is between 1 nm and 10 nm or between 1 nm and 3 nm.

A lower dummy gate 1125L is deposited on the lower spacer 1110. The lower dummy gate 1125L is made of a sacrificial gate material, for example, amorphous silicon (αSi) or polycrystalline silicon (polysilicon). The sacrificial gate material is removed at a much higher rate when etched with certain processes than the materials making the spacers 1110/1176/1120. In some embodiments, the liner 1105 material is selective as well when the sacrificial gate material is removed.

The sacrificial material may be deposited by a known deposition process, including, but not limited to, PVD, CVD, PECVD, inductively coupled plasma chemical vapor deposition (ICP CVD), or any combination thereof. The sacrificial material forming the lower dummy gate 1125L has a thickness 1126L of about 8 nm to about 100 nm, or from about 10 nm to about 30 nm.

An inter-gate spacer 1175 is deposited on the lower dummy gate 1125L. The inter-gate spacer 1175 electrically isolates the lower and upper gate stacks formed below. In some embodiments, the inter-gate spacer 1175 is made of the same material and deposited by the same methods as the lower spacer 1110. The inter-gate spacer 1175 has an inter-gate spacer thickness 1176 approximately between 5 nm and 12 nm or between 6 nm and 8 nm.

An upper dummy gate 1125U is deposited on the inter-gate spacer 1175. In some embodiments, the upper dummy gate 1125U is made of the same materials (e.g. amorphous silicon (α-Si) or polycrystalline silicon (polysilicon)) and deposited by the same processes as the lower dummy gate 1125L. The upper dummy gate 1125U has a thickness 1126U of about 8 nm to about 100 nm, or from about 10 nm to about 30 nm.

An upper spacer 1120 is deposited with a directional deposition technique on the upper dummy gate 1125U with an upper spacer 1120 thickness 1121 of approximately between 3 nm and 15 nm. In some embodiments, the upper spacer 1120 is made of a dielectric nitride (e.g., silicon nitride) or a dielectric oxynitride, e.g. SiOCN, or SiBC. In some embodiments, the upper spacer 1120 is made of silicon nitride deposited by a process like CVD or PVD.

The upper spacer 1120 thickness 1121 is thin enough so that an upper overlap 1150U between the bottom surface of the upper spacer 1120 and the upper Schottky junction 850U.

In other words, the upper dummy gate 1125U will have an upper overlap 1150U of the upper Schottky junction 850U and the top/upper silicide region 830.

In some embodiments, the upper overlap 1150U is between 1 nm and 10 nm or between 1 nm and 3 nm.

A cap layer 1190 is deposited on the upper dielectric spacer 1120 by known deposition techniques like CVD, PCVD, ALD, etc. In some embodiments the cap layer is made of an oxide including, as non-limiting examples, silicon dioxide, high aspect ratio plasma (HARP) oxide, high temperature oxide (HTO), and high-density plasma (HDP) oxide. The cap layer 1190 has a thickness 1191 in a range from about 30 nm to about 200 nm, or from about 50 nm to about 100 nm.

The cap layer 1190 of the structure 1100 is planarized using a known chemical-mechanical polishing (CMP) to create a flat top surface.

In some embodiments, alternative sacrificial materials are envisioned for making the lower 1125L and/or the upper 1125U dummy gates. These materials are chosen so the liner 1105 and spacers 1110/1175/1120 are selectively and substantially not etched when the lower and upper dummy gates 1125L/1125U are removed.

In some embodiments, the liner 1105 is made from a material that is selectively different than the material making the spacers 1110/1175/1120 as well.

Figure 12:
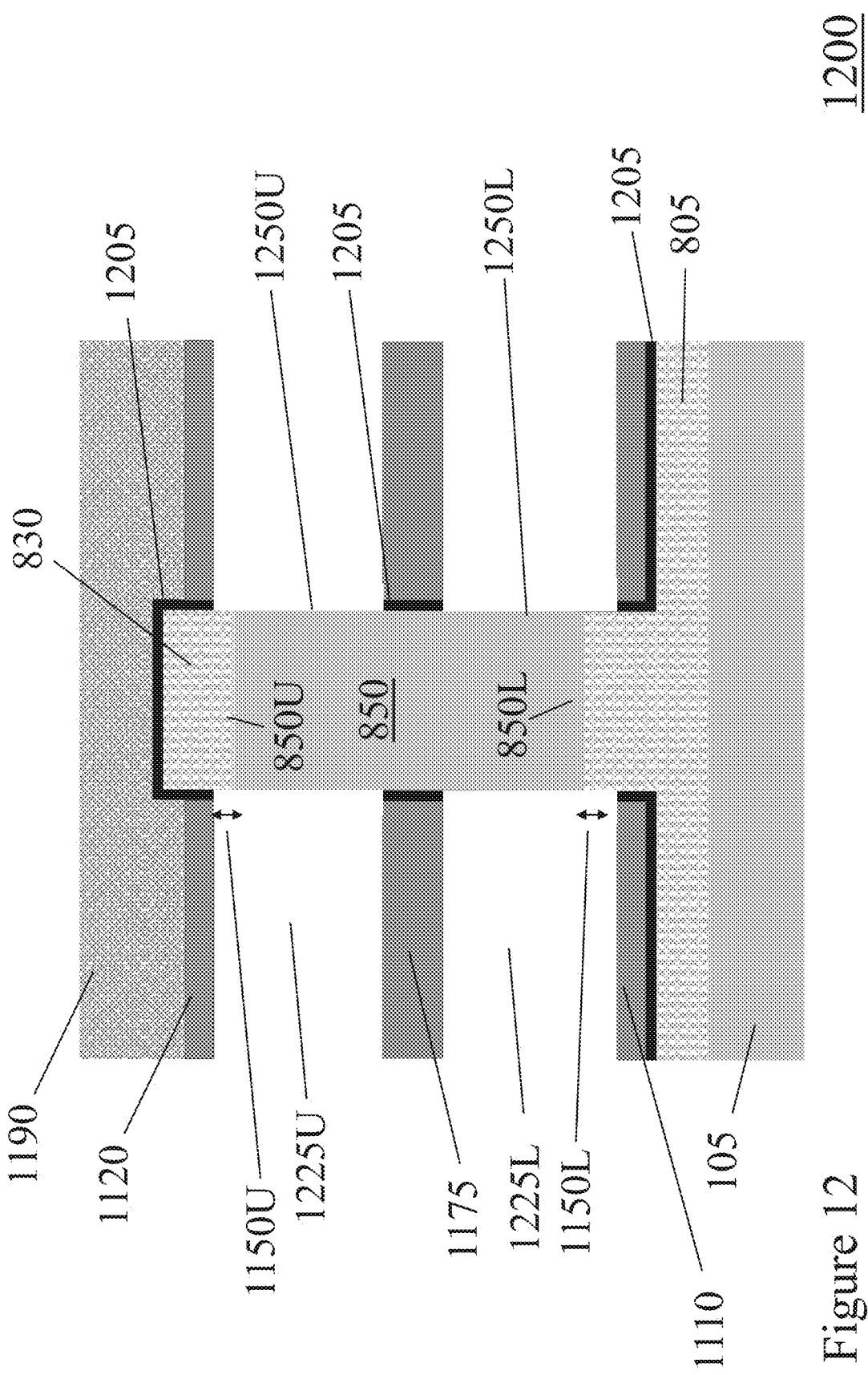
FIG. 12 is a cross section of the multilayer stack with exposed parts of the channel sides and exposed Schottky junctions after removing dummy gate regions and portions of a liner.

FIG. 12 is a cross section of the multilayer stack structure 1200 with exposed parts of the channel sides 1250L/1250U after removing dummy gate regions and portions of a liner 1225L/1225U.

The sacrificial material in the lower dummy gate 1125L and/or the upper 1125U dummy gate regions is selectively removed from (e.g. to create): 1. a lower gate cavity 1225L between the lower spacer 1110 and the inter-gate spacer 1175 and 2. and an upper gate cavity 1225U between the inter-gate spacer 1175 and upper spacer 1120.

In some embodiments, the sacrificial materials in the lower 1125L and upper 1125U dummy gate regions are removed by a dry etch or exposure to ammonium hydroxide ($NH_4OH$) at higher than room temperature. Alternative removal methods include exposure to a solution of hydrofluoric acid (HF) or use of a dry chemical oxide etch. Any liner 1105 material remaining in the lower 1225L and/or upper 1225U gate cavities can be removed using known processes that are selective (do not substantially remove) the surface of the lower 1250L and/or upper 1250U exposed sides of the single vertical channel 850 and the spacers 1110/1175/1120.

Figure 13:
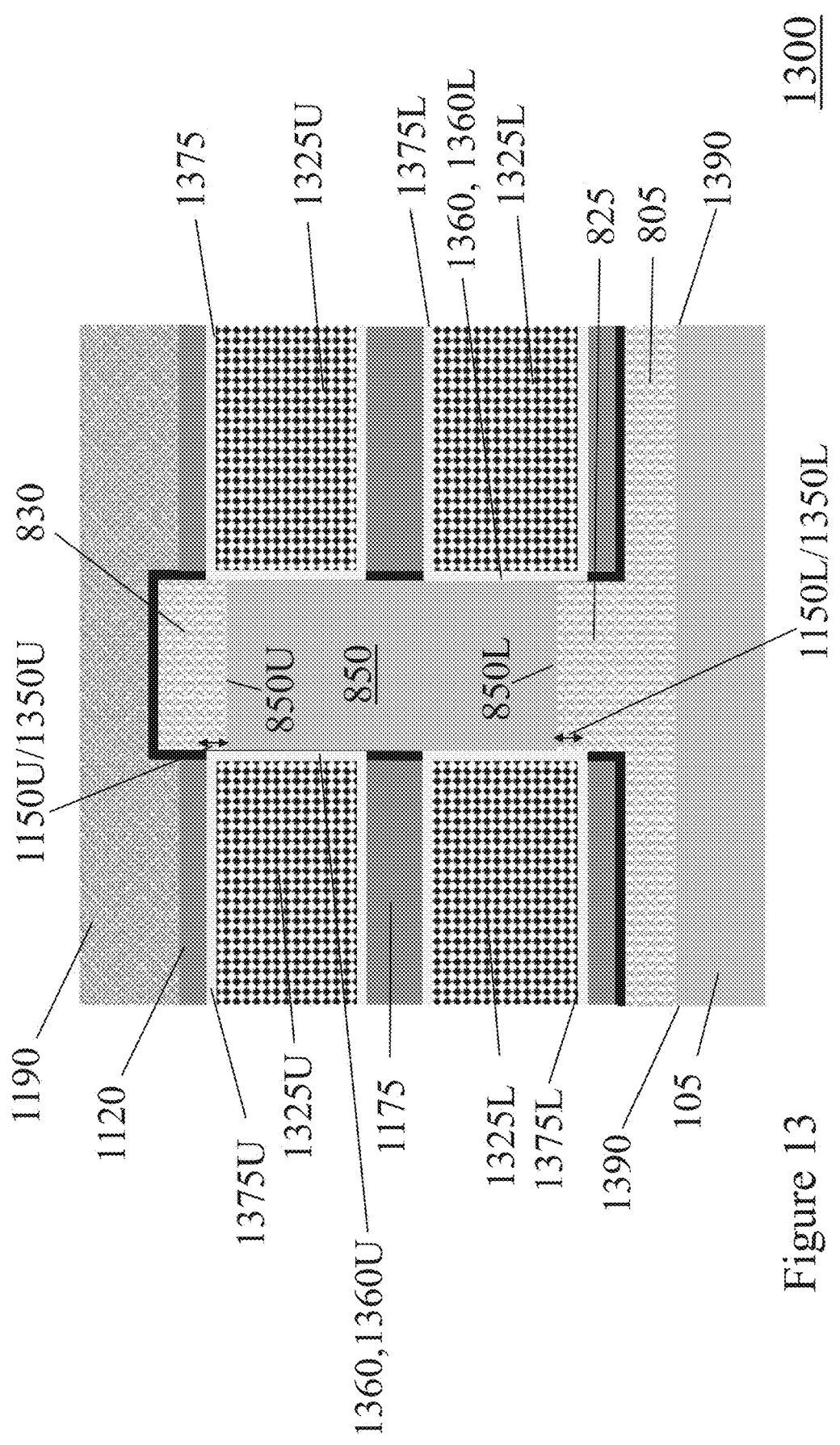
FIG. 13 is a Vertical Reconfigurable Field Effect Transistor after formation of the gate stacks.

FIG. 13 is a Vertical Reconfigurable Field Effect Transistor (VRFET) 1300 after formation of two gate stacks, a lower gate stack 1325L/1375L and an upper gate stack 1325U/1375U.

In some embodiments, the gate stacks 1325L/1375L and 1325U/1375U are formed simultaneously and are made of the same materials. The lower gate stack 1325L/1375L is made of a thin layer of high-k dielectric material 1375L and a metal gate 1325L material. The upper gate stack 1325U/1375U is made of a thin layer of high-k dielectric material 1375U (the same material as 1375L) and a metal gate 1325U (the same material as 1325L).

The upper gate stack 1325U/1375U is stacked above the lower gate stack 1325L/1375L. In some embodiments, the upper gate stack 1325U/1375U and the lower gate stack 1325L/1375L have the same vertical projection 1390 on the substrate 105. This reduces the footprint of the device 1300.

Both the lower gate stack 1325L/1375L and the upper gate stack 1325U/1375U encompass the entire single vertical channel 850.

However, the lower gate stack 1325L/1375L and the upper gate stack 1325U/1375U are electrically isolated from one another by the inter-gate spacer 1175.

The lower gate stack high-k dielectric layer 1375L is in direct contact with the exposed lower surface 1360/1360L of the vertical channel 850 and the overlapped 1150L/1350L bottom/lower silicide region 825.

The upper gate stack high-k dielectric layer 1375U is in direct contact with the exposed upper surface 1360/1360U of the vertical channel 850 and the overlapped 1150U/1350U top/upper silicide region 830.

In other words, the lower gate stack 1325L/1375L encompasses and overlaps 1350L the lower Schottky junction 850L and the upper gate stack 1325U/1375U encompasses and overlaps 1350U the upper Schottky junction 850U.

The overlap 1350L of the lower Schottky junction 850L allows a voltage applied to the lower gate stack 1325L/1375L to control the lower Schottky junction 850L. The overlap 1350U of the upper Schottky junction 850U allows a voltage applied to the upper gate stack 1325U/1375U to control the upper Schottky junction 850U.

Again, the lower gate stack 1325L/1375L and the upper gate stack 1325U/1375U are electrically insulated from one another by the inter-gate spacer 1175. Therefore, the lower Schottky junction 850L and the upper Schottky junction 850U can be separately controlled.

Since the upper gate stack 1325U/1375U (and the upper Schottky junction 850U overlapped 1350U) is stacked upon the lower gate stack 1325L/1375L (and the lower Schottky junction 850L overlapped 1350L), the VRFET 1300 is made having a single vertical channel 850. Accordingly, the VRFET 1300 has a greatly reduced footprint.

The lower 1375L and upper 1375U gate stack high-k dielectric layers, can be made of a dielectric material having a dielectric constant greater than 3.9, more preferably above 7.0, and still more preferably above 10.0. Non-limiting examples of suitable materials for the gate dielectric material 1375L/1375U include oxides, nitrides, oxynitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum.

The gate dielectric layer material 1375L/1375U may be formed by suitable deposition processes, for example, CVD, PECVD, ALD, evaporation, physical vapor deposition (PVD), chemical solution deposition, or other like processes. The thickness of the gate dielectric material (1375L, 1375U) may vary depending on the deposition process as well as the composition and number of high-k dielectric materials used.

The metal gate 1325L/1325U material is a conductive metal that is deposited over the gate dielectric 1375L/1375U material(s) to form the gate stack. Non-limiting examples of suitable metal gate 1325L/1325U material include aluminum (Al), platinum (Pt), gold (Au), tungsten (W), titanium (Ti), cobalt (Co), or any combination thereof. The metal gate 1325L/1325U material may be deposited by a suitable deposition process, for example, CVD, PECVD, PVD, plating, thermal or e-beam evaporation, and sputtering.

Figure 14:
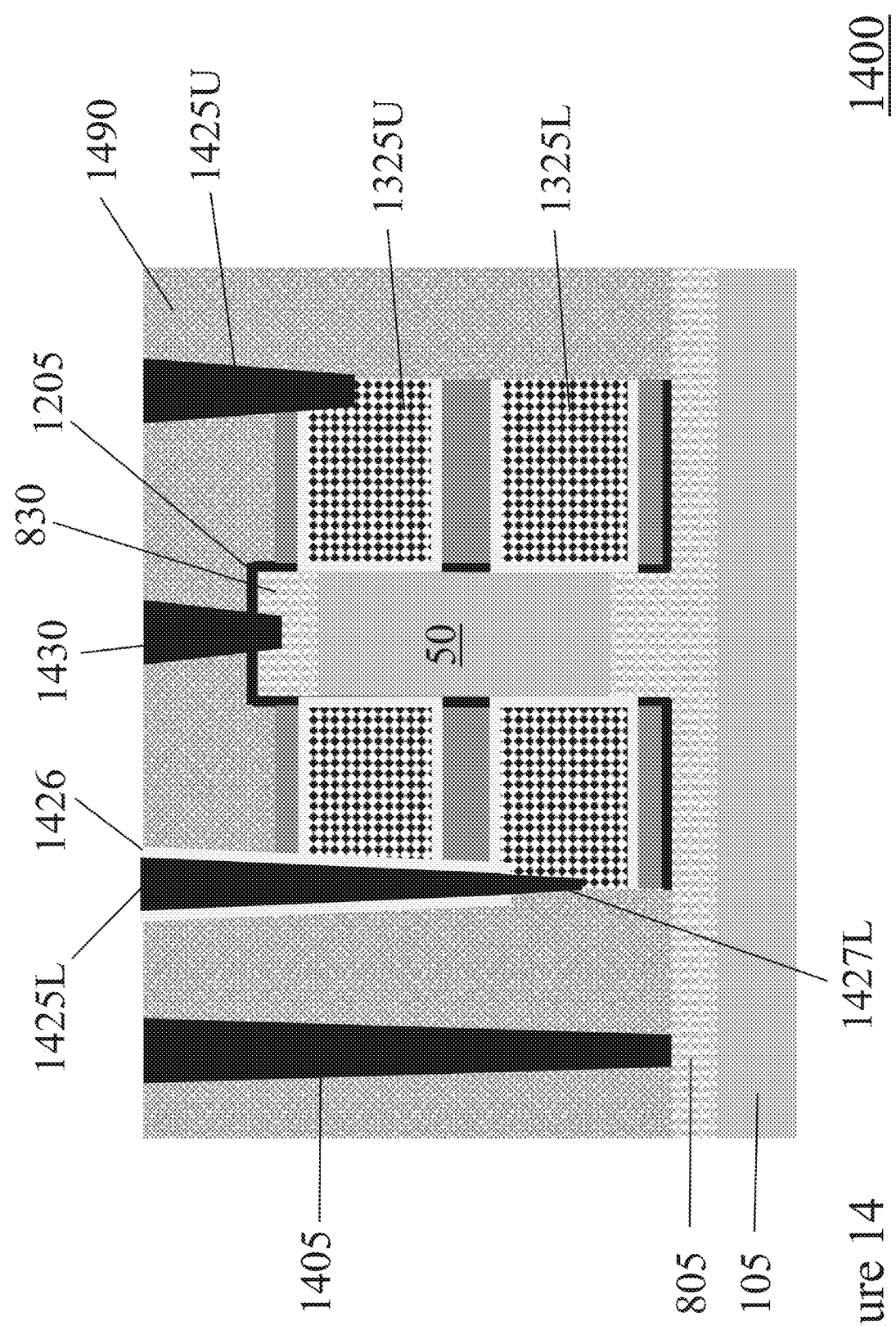
FIG. 14 is a Vertical Reconfigurable Field Effect Transistor after formation of external electrical connections.

FIG. 14 is a Vertical Reconfigurable Field Effect Transistor (VRFET) 1400 after formation of external electrical connections 1405/1425L/1425U/1430.

An interlayer dielectric layer (ILD) 1490 is deposited on the structure 1300. The ILD 1490 is made from a low-k dielectric material (e.g. with a k<4.0), including but not limited to, silicon oxide, spin-on-glass, a flowable oxide, a high-density plasma oxide, borophosphosilicate glass (BPSG), or any combination thereof. The ILD 1490 is deposited by a deposition process, including, but not limited to CVD, PVD, PECVD, ALD, evaporation, chemical solution deposition, or like processes.

In some embodiments, the ILD 1490 is made of the same material making the cap layer 1190, e.g. silicon dioxide.

External electrical connections 1405/1425L/1425U/1430 can be formed by different known techniques. For example, trenches in the ILD 1490 are made with a patterned etch (RIE), e.g. using a patterned photo resist. Alternative methods include laser drilling of vias through the ILD 1490.

The trenches are filled with a conductive material or a combination of conductive materials 1405/1425L/1425U/1430. The conductive material may be a conductive metal, for example, aluminum (Al), platinum (Pt), gold (Au), tungsten (W), titanium (Ti), cobalt (Co) or any combination thereof.

The conductive material may be deposited by a suitable deposition process, for example, CVD, PECVD, PVD, plating, thermal or e-beam evaporation, or sputtering.

For example, connection 1405 fills a trench/via, makes contact with the substrate silicide layer 805, and forms an external electrical connection to the lower Schottky junction 850L, i.e. a lower source/drain (S/D) connection 1405.

Connection 1430 fills a trench/via, contacts the top/upper silicide region 830, and forms an external electrical connection to the upper Schottky junction 850U, i.e. an upper S/D connection 1430.

It is noted that since the lower Schottky junction 850L and upper Schottky junction 850U respectively form the lower and upper S/D of the VRFET 1400. No doping of the lower or upper S/Ds was necessary.

To continue, connection 1425U fills a trench/via, and contacts the upper gate stack 1325U/1375U through the upper metal gate 1325U.

In some embodiments, the connection 1425L fills a trench/via that is lined with an electrically insulating liner 1426. The liner 1426 can be formed by a conformal deposition like ALD. The liner is not present where the connection 1425 makes electrical connection 1427L with the lower gate stack 1325L/1375L through the lower metal gate 1375L. However, the insulating liner 1426 prevents the connection 1425L from electrically contacting the upper gate stack 1325U/1375U.

The electrically insulating liner 1426 maintains the electrical isolation between the lower 1325L/1375L and upper 1325U/1375U gate stacks.

It is further noted that the footprint of the device 1400 could be made smaller by placing the one or more of the external electrical connections (e.g. 1405) outside the plane of the figure, e.g. either forward of behind the cross-section 1400 shown.

Figure 15:
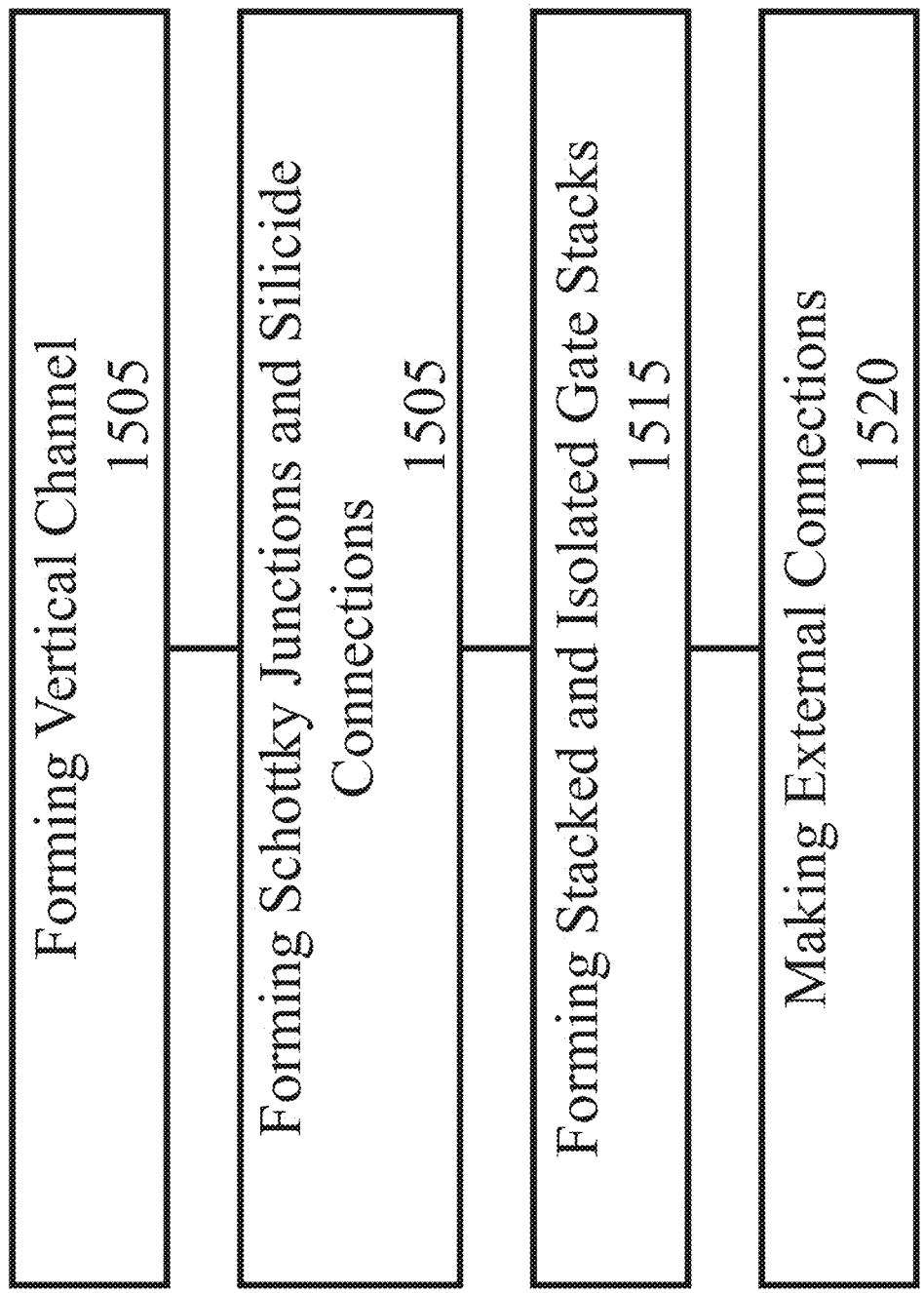
FIG. 15 is a flow chart of process for making a Vertical Reconfigurable Field Effect Transistor.

FIG. 15 is a flow chart of process 1500 for making a Vertical Reconfigurable Field Effect Transistor (VRFET).

Step 1505 of the process 1500 forms a single vertical channel 850. Embodiments of this step are described in the description of FIGS. 1 through 8.

Step 1510 of the process forms the lower 850L and upper 850U Schottky junctions connected to the respective bottom/lower silicide region 825 and top/upper silicide region 830. Embodiments of this step are described in the description of FIGS. 6 through 10.

Step 1515 of the process forms the stacked and electrically isolated (from one another) lower 1325L/1375L and upper 1325U/1375U gate stacks. Embodiments of this step are described in the description of FIGS. 11 through 13.

Step 1520 makes the external electrical connections to the lower S/D 1405, upper S/D 1430, lower gate stack 1425L, and upper gate stack 1425U. Embodiments of this step are described in the description of FIG. 14.

The lower 1325L/1375L and upper 1325U/1375U gate stacks are electrically insulated and therefore operate independently. In other words, the lower Schottky junction 850L, is controlled by a lower voltage applied to the lower gate stack 1325L/1375L connection 1425L. The upper Schottky junction 850U is controlled by an upper voltage applied to the upper gate stack 1325U/1375U connection 1425U. Accordingly, the lower Schottky junction 850L and the upper Schottky junction 850U are controlled separately and independently.

In one embodiment, a first Schottky junction (850L or 850U) is controlled to turn on or off current flowing through the channel 850. The other Schottky junction, a second Schottky junction (850U or 850L), is controlled to determine whether the device 1400 has the electrical characteristics of a p-FET or an n-FET.

In one example, the device 1400 is biased as an n-FET by applying a positive voltage (e.g. of a positive supply voltage VDD) to the gate stack connection (1425U or 1425L) controlling the second Schottky junction (850U or 850L) while a logical low (LOW) voltage is applied to the first S/D connection (1405 or 1430) and a logical high (HIGH) voltage is applied to the second S/D connection (1430 or 1405); and the current flowing through the channel 850 can be turned on (or off) by applying a HIGH (or LOW) voltage to the gate stack connection (1425L or 1425U) controlling the first Schottky junction (850L or 850U).

In another example where the device 1400 is operated as a p-FET, the device 1400 is turned on by applying a negative (e.g. of a negative supply voltage, VSS) or ground (GND) voltage to the gate stack connection (1425U or 1425L) controlling the second Schottky junction (850U or 850L) while a HIGH voltage is applied to the first S/D connection (1405 or 1430) and a LOW voltage is applied to the second S/D connection (1430 or 1405); and the current flowing through the channel 850 can be turned on (or off) by applying a LOW (or HIGH) voltage to the gate stack connection (1425L or 1425U) controlling the first Schottky junction (850L or 850U).

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. For example, the semiconductor devices, structures, and methods disclosed in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, expert and artificial intelligence systems, functional circuitry, etc. Systems and hardware incorporating the semiconductor devices are contemplated embodiments of the invention.

The terminology used herein was chosen to explain the principles of the embodiments and the practical application or technical improvement over technologies found in the marketplace or to otherwise enable others of ordinary skill in the art to understand the embodiments disclosed herein. Devices, components, elements, features, apparatus, systems, structures, techniques, and methods described with different terminology that perform substantially the same function, work in the substantial the same way, have substantially the same use, and/or perform the similar steps are contemplated as embodiments of this invention.

We claim:

1. A Reconfigurable Field Effect Transistor (RFET) comprising:
    a substrate;
    a vertical channel, the vertical channel made from a semiconductor material, the vertical channel in contact with a bottom silicide region forming a lower Schottky junction with the vertical channel and a top silicide region forming an upper Schottky junction with the vertical channel, the bottom silicide region and the top silicide region each being a source/drain (S/D) of the RFET;
    a lower gate stack surrounding the vertical channel and having a lower overlap encompassing the lower Schottky junction; and
    an upper gate stack surrounding the vertical channel having an upper overlap encompassing the upper Schottky junction,
wherein the lower gate stack is electrically insulated from the upper gate stack, and
wherein the lower overlap is between 1 nanometer (nm) and 10 nm, and
wherein the upper overlap is between 1 nanometer (nm) and 10 nm.

2. The RFET, as in claim 1, where the upper gate stack is stacked above the lower gate stack and there is an inter-gate spacer between the upper gate stack and the lower gate stack, the inter-gate spacer made of electrically insulating material that electrically insulates the lower gate stack from the upper gate stack.

3. The RFET, as in claim 1, where the upper gate stack is connected to an external upper voltage and the lower gate stack is connected to an external lower voltage, wherein the external upper voltage is a different voltage than the external lower voltage.

4. The RFET, as in claim 1, where an external lower voltage is applied to the lower gate stack that controls the lower Schottky junction and an external upper voltage is applied to the upper gate stack that controls the upper Schottky junction, and the lower Schottky junction and the upper Schottky junction are controlled separately and independently.

5. The RFET, as in claim 4, where an external voltage applied to a first gate stack controls current flow through the channel.

6. The RFET, as in claim 5, where an external voltage applied to a second gate stack determines if the RFET has electrical characteristics of a p-FET or an n-FET.

7. A Reconfigurable Field Effect Transistor (RFET) comprising:
    a semiconductor substrate;
    a vertical channel, the vertical channel made from silicon, the vertical channel in contact with a bottom silicide region forming a lower Schottky junction with the vertical channel and a top silicide region forming an upper Schottky junction with the vertical channel, the bottom silicide region and the top silicide region each being a source/drain (S/D);
    a lower gate stack surrounding the vertical channel and having a lower overlap encompassing the lower Schottky junction;

an upper gate stack surrounding the vertical channel having an upper overlap encompassing the upper Schottky junction; and an inter-gate spacer is deposited between the lower gate stack and the upper gate stack, the inter-gate spacer electrically insulating the lower gate stack from the upper gate stack, wherein the upper gate stack is stacked above the lower gate stack so that the upper gate stack and the lower gate stack have the same vertical projection on the semiconductor substrate, and wherein the lower overlap is between 1 nanometer (nm) and 10 nm, and wherein the upper overlap is between 1 nanometer (nm) and 10 nm.

8. The RFET, as in claim 7, where the vertical channel is undoped.

9. The RFET, as in claim 7, further comprising a lower spacer between the substrate and the lower gate stack and an upper spacer above the upper gate stack.

10. The RFET, as in claim 7, wherein the lower gate stack is connected to a lower external electrical connection and the upper gate stack is connected to an upper external electrical connection, and wherein the lower external electrical connection and the upper external electrical connection are not electrically connected to one another.

11. The RFET, as in claim 10, wherein an external voltage applied to one of the i. lower external electrical connection and ii. the upper external electrical connection, and the external voltage applied enables control of a current flow through the channel.

12. The RFET, as in claim 11, where the external voltage applied enables turning the current flow through the channel on and off.

13. The RFET, as in claim 10, wherein an external voltage is applied to one of i. the lower external electrical connections and ii. the upper external electrical connection and the external voltage determines if the RFET has electrical characteristics of a p-FET or an n-FET.

14. The RFET, as in claim 13, where the RFET is controlled as an n-FET by applying a positive external voltage to the upper external electrical connection controlling the upper Schottky junction, by applying a logical LOW voltage to a first S/D of one of the S/Ds, and by applying a logical HIGH to a second S/D of one of the S/Ds.

15. The RFET, as in claim 14, where the positive external voltage and the logical HIGH is a positive supply voltage.

16. The RFET, as in claim 14, where current flowing through the channel is turned on by applying a HIGH voltage or a LOW voltage to the lower external electrical connection controlling the lower Schottky junction.

17. The RFET, as in claim 13, where the RFET is controlled as an p-FET by applying a negative external voltage to the upper external electrical connection controlling the upper Schottky junction, by applying a logical LOW voltage to a first S/D of one of the S/Ds, and by applying a logical HIGH to a second S/D of one of the S/Ds.

18. The RFET, as in claim 17, where the negative external voltage and the logical LOW is one of a negative supply voltage and a ground voltage.

* * * * *